(12) United States Patent
Arakawa (10) Patent No.: US 12,087,475 B2
(45) Date of Patent: Sep. 10, 2024

(54) WIRE HARNESS WITH WATERPROOFED SHIELD

(71) Applicant: SUMITOMO WIRING SYSTEMS, LTD., Yokkaichi (JP)

(72) Inventor: Hiroyuki Arakawa, Yokkaichi (JP)

(73) Assignee: SUMITOMO WIRING SYSTEMS, LTD., Yokkaichi (JP)

( * ) Notice: Subject to any disclaimer, the term of this patent is extended or adjusted under 35 U.S.C. 154(b) by 116 days.

(21) Appl. No.: 17/907,542

(22) PCT Filed: Mar. 10, 2021

(86) PCT No.: PCT/JP2021/009458
§ 371 (c)(1),
(2) Date: Sep. 28, 2022

(87) PCT Pub. No.: WO2021/199984
PCT Pub. Date: Oct. 7, 2021

(65) Prior Publication Data
US 2023/0146742 A1  May 11, 2023

(30) Foreign Application Priority Data
Mar. 30, 2020 (JP) .................................. 2020-059859

(51) Int. Cl.
*H01B 7/282* (2006.01)
*H01B 7/00* (2006.01)
*H05K 9/00* (2006.01)

(52) U.S. Cl.
CPC ........... *H01B 7/282* (2013.01); *H01B 7/0045* (2013.01); *H05K 9/0098* (2013.01)

(58) Field of Classification Search
None
See application file for complete search history.

(56) References Cited

U.S. PATENT DOCUMENTS

| 3,408,453 A | * | 10/1968 | Shelton, Jr. | ............. | H01B 7/08 |
| | | | | | 174/120 SR |
| 4,145,567 A | * | 3/1979 | Bahder | ................. | H01B 9/022 |
| | | | | | 174/13 |

(Continued)

FOREIGN PATENT DOCUMENTS

| CN | 104115334 A | * | 10/2014 | .......... H01B 7/0045 |
| JP | 2002186131 A | | 6/2002 | |

(Continued)

OTHER PUBLICATIONS

English translation of the International Preliminary Report of corresponding PCT Application No. PCT/JP2021/009458.

*Primary Examiner* — Binh B Tran
*Assistant Examiner* — Muhammed Azam (57) ABSTRACT

A wire harness includes a shielded electric wire that includes a first coated electric wire that includes a first core electric wire and a first insulating coating that covers the first core electric wire, an electromagnetic shield member that covers the first coated electric wire, a sheath that covers the electromagnetic shield member, and a shield member exposed portion from which the sheath is removed and the electromagnetic shield member is exposed, an insulating cover that covers the shield member exposed portion, and a waterproofing agent applied to the shield member exposed portion and permeated into the electromagnetic shield member. The waterproofing agent is in tight contact with an inner circumferential surface of the sheath and an outer circumferential surface of the first insulating coating. The cover covers a portion of the shield member exposed portion.

12 Claims, 4 Drawing Sheets

(56) References Cited

U.S. PATENT DOCUMENTS

| | | | | |
|---|---|---|---|---|
| 4,472,597 A | * | 9/1984 | Uematsu | H01B 9/02 174/106 SC |
| 4,701,575 A | * | 10/1987 | Gupta | H01B 7/282 174/109 |
| 8,101,034 B2 | * | 1/2012 | Bertini | H01B 7/285 156/48 |
| 9,281,102 B2 | * | 3/2016 | Molvig-Lundegaard | H01B 7/288 |
| 9,531,180 B2 | * | 12/2016 | Xu | H01R 13/5213 |
| 9,663,863 B2 | * | 5/2017 | Takata | C23F 11/173 |
| 10,058,313 B2 | * | 8/2018 | Manasse | A61B 17/3423 |
| 10,314,111 B2 | * | 6/2019 | Barfuss | B62D 1/065 |
| 11,304,795 B2 | * | 4/2022 | Folan | A61F 2/07 |
| 11,464,125 B2 | * | 10/2022 | Huang | H05K 5/062 |
| 11,504,231 B2 | * | 11/2022 | Carlino | A61F 2/2409 |
| 11,505,138 B2 | * | 11/2022 | Sugihara | H02G 3/0468 |
| 11,525,212 B2 | * | 12/2022 | Erlendsson | A01K 75/00 |
| 11,621,104 B1 | * | 4/2023 | Lesko | H01B 7/14 174/102 R |
| 11,887,757 B2 | * | 1/2024 | Araki | H01B 7/0045 |
| 11,887,759 B2 | * | 1/2024 | Araki | H01B 13/012 |
| 11,908,598 B2 | * | 2/2024 | Araki | H01B 7/285 |
| 2007/0215374 A1 | * | 9/2007 | Ichikawa | H01R 4/72 174/75 C |
| 2008/0000672 A1 | * | 1/2008 | Yamamoto | H01R 13/5208 174/23 R |
| 2010/0212936 A1 | * | 8/2010 | Arai | H01B 7/285 29/857 |
| 2011/0045697 A1 | * | 2/2011 | Sawamura | B60R 16/0207 427/117 |
| 2013/0126232 A1 | * | 5/2013 | Sakuma | H01B 7/282 174/72 A |
| 2014/0151087 A1 | * | 6/2014 | Adachi | H02G 3/0406 174/153 G |
| 2014/0305678 A1 | * | 10/2014 | Fukuda | H01R 4/72 29/825 |
| 2015/0060134 A1 | * | 3/2015 | Minami | H01B 7/282 174/72 A |
| 2015/0179302 A1 | * | 6/2015 | Lin | H01B 7/282 174/69 |
| 2015/0287496 A1 | * | 10/2015 | Sato | H01R 4/70 29/867 |
| 2015/0372464 A1 | * | 12/2015 | Wakabayashi | H02G 15/043 174/68.3 |
| 2016/0042835 A1 | * | 2/2016 | Lustig | H05K 9/0084 174/105 R |
| 2016/0126709 A1 | * | 5/2016 | Maeda | B60R 16/0215 174/68.3 |
| 2016/0129861 A1 | * | 5/2016 | Oga | B60R 16/0215 174/72 A |
| 2016/0148722 A1 | * | 5/2016 | Hagi | H01B 7/2825 174/128.1 |
| 2016/0155537 A1 | * | 6/2016 | Manabe | B32B 3/30 428/164 |
| 2016/0260523 A1 | * | 9/2016 | Aragiri | H01B 7/282 |
| 2018/0019040 A1 | * | 1/2018 | Oshiumi | H01R 4/185 |
| 2018/0233893 A1 | * | 8/2018 | Adachi | H01B 7/18 |
| 2019/0096543 A1 | * | 3/2019 | Itou | H02G 15/003 |
| 2022/0115165 A1 | * | 4/2022 | Johanson | B23K 35/286 |
| 2022/0295676 A1 | * | 9/2022 | Witherspoon | E04B 1/6812 |
| 2023/0022337 A1 | * | 1/2023 | Okada | H01B 7/40 |
| 2023/0139062 A1 | * | 5/2023 | Mauri | H01B 7/282 174/21 R |

FOREIGN PATENT DOCUMENTS

| | | | | |
|---|---|---|---|---|
| JP | 2011155763 A | | 8/2011 | |
| JP | 2019062603 A | | 4/2019 | |
| WO | WO-2012043793 A1 | * | 4/2012 | ............ H01R 4/18 |
| WO | WO-2016098734 A1 | * | 6/2016 | ............ H01B 7/00 |

* cited by examiner

WIRE HARNESS WITH WATERPROOFED SHIELD

BACKGROUND

Technical Field

The present disclosure relates to a wire harness.

Conventionally, a wire harness that employs a shielded electric wire to address electromagnetic noise has been known in the field of wire harnesses to which large currents are supplied. A shielded electric wire has a structure in which a coated electric wire is enclosed in an electromagnetic shield member such as metal foil or a metal braided tube, and the electromagnetic shield member is covered by a sheath that is an insulating covering member.

In the field of wire harnesses that employ a shielded electric wire, a structure has been proposed in which an end of the sheath is peeled off to expose the electromagnetic shield member at one end of the shielded electric wire, and the exposed core wire is connected to one end of a grounding electric wire. A grounding terminal provided at the other end of the grounding electric wire is grounded to the housing of a peripheral device, a vehicle body panel, or the like so that the shielded electric wire can achieve a stable electromagnetic shielding effect.

It is necessary to improve the waterproof property of the portion where the end of the sheath of the shielded electric wire is peeled off and the electromagnetic shield member is exposed. For example, Japanese Laid-Open Patent Publication No. 2009-135073 proposes providing an intermediate portion of the shielded electric wire in the lengthwise direction thereof with an intermediate waterproof portion formed by impregnating the exposed portion of the shield member, exposed by peeling off a portion of the sheath, with a waterproofing agent such as silicone. As a result, the waterproofing agent applied to the exposed portion of the shield member permeates into the sheath on both sides of the exposed portion of the shield member, forming a waterproofing area in which the gap between the inner circumferential surface of the sheath and the electromagnetic shield member and the gap between the electromagnetic shield member and the coated electric wire are closed with the waterproofing agent. As a result, in the intermediate portion of the shielded electric wire in the lengthwise direction thereof, the gap between the electromagnetic shield member and the sheath and the coated wire can be closed with the waterproofing agent.

SUMMARY

In order for the waterproofing agent that has permeated into the electromagnetic shield member to exhibit the desired waterproofing performance, the waterproofing agent that has permeated into the sheath through the electromagnetic shield member needs to be sufficiently dried and solidified.

Therefore, a wire harness with a novel structure that can prevent the waterproofing agent penetrated into the sheath from being hindered from drying is disclosed herein.

A wire harness according to the present disclosure is a wire harness that includes: a shielded electric wire that includes a first coated electric wire that includes a first core electric wire and a first insulating coating that covers the first core electric wire, an electromagnetic shield member that covers the first coated electric wire, a sheath that covers the electromagnetic shield member, and a shield member exposed portion from which the sheath is removed and the electromagnetic shield member is exposed; an insulating cover that covers the shield member exposed portion; and a waterproofing agent applied to the shield member exposed portion and permeated into the electromagnetic shield member. The waterproofing agent is in tight contact with an inner circumferential surface of an end portion of the sheath on the shield member exposed portion side and an outer circumferential surface of the first insulating coating so that a waterproofing area is formed, and the cover is separated from the end portion of the sheath, in a first direction that is a lengthwise direction of the shielded electric wire, and covers a portion of the shield member exposed portion.

According to the present disclosure, it is possible to provide a wire harness that can prevent a waterproofing agent that has permeated into the sheath from being hindered from drying.

DETAILED DESCRIPTION

Description of Embodiments According to Present Disclosure

First, embodiments of the present disclosure will be listed and described.

A wire harness according to the present disclosure is (1) a wire harness that includes: a shielded electric wire that includes a first coated electric wire that includes a first core electric wire and a first insulating coating that covers the first core electric wire, an electromagnetic shield member that covers the first coated electric wire, a sheath that covers the electromagnetic shield member, and a shield member exposed portion from which the sheath is removed and the electromagnetic shield member is exposed; an insulating cover that covers the shield member exposed portion; and a waterproofing agent applied to the shield member exposed portion and permeated into the electromagnetic shield member. The waterproofing agent is in tight contact with an inner circumferential surface of an end portion of the sheath on the shield member exposed portion side and an outer circumferential surface of the first insulating coating so that a waterproofing area is formed, and the cover is separated from the end portion of the sheath, in a first direction that is a lengthwise direction of the shielded electric wire, and covers a portion of the shield member exposed portion.

The wire harness according to the present disclosure includes a shield member exposed portion from which the sheath is removed and the electromagnetic shield member is exposed, and a portion of the shield member exposed portion is covered by the cover. The waterproofing agent is applied to the shield member exposed portion that is not covered by the cover, and therefore, it is possible to reduce the amount of the waterproofing agent that is to be applied to the shield member exposed portion by the amount corresponding to the area covered by the cover. Also, it is possible to prevent the waterproofing agent from being excessively applied to the shield member exposed portion. As a result, the waterproofing agent can be prevented from permeating into the sheath, and from being hindered from drying in the areas where the waterproofing agent is in tight contact with the inner circumferential surface of an end portion of the sheath on the shield member exposed portion side and the outer circumferential surface of the first insulating coating (hereinafter referred to as a waterproofing area as appropriate). As a result of the waterproofing agent drying as desired, the state in which the waterproofing agent is in tight contact with the inner circumferential surface of the sheath and the outer circumferential surface of the first insulating coating is desirably maintained. Therefore, it is possible to improve the waterproofing performance of the waterproofing agent. In addition, as a result of the amount of the waterproofing agent that is to be applied being reduced, it is also possible to reduce the manufacturing costs of the wire harness.

Note that the cover that covers a portion of the shield member exposed portion may be formed by leaving a portion of the sheath that is to be removed to provide the shield member exposed portion, or by covering a portion of the shield member exposed portion with another member such as a piece of binding tape. However, note that the cover is separated from the end portion of the sheath on the shield member exposed portion side in the first direction that is the lengthwise direction of the shielded electric wire.

(2) It is preferable that the sheath includes a first split sheath portion that is located on one side of the shield member exposed portion in the first direction, and a second split sheath portion that is located on the other side of the electromagnetic shield member, the waterproofing agent is in tight contact with an inner circumferential surface of the first split sheath portion and the outer circumferential surface of the first insulating coating, and the cover is located between the first split sheath portion and the second split sheath portion in the first direction. The cover is located between the first split sheath portion and the second split sheath portion in the first direction of the cover, and therefore the waterproofing agent can be distributed to both the first split sheath portion and the second split sheath portion. The waterproofing agent also permeates into the second split sheath portion, and therefore the waterproofing agent can be prevented from jutting out from the shield member exposed portion. In addition, the waterproofing agent is in tight contact with the inner circumferential surface of the first split sheath portion and the outer circumferential surface of the first insulating coating, and therefore water can be stopped on the first split sheath portion side. Note that the waterproofing agent may also be in tight contact with the inner circumferential surface of the second split sheath portion and the outer circumferential surface of the first insulating coating in the second split sheath portion in order to realize waterproofing. The amount of the waterproofing agent that permeates into the first split sheath portion and the second split sheath portion can be controlled to an appropriate amount by controlling the size of the area covered by the cover. As a result, it is possible to prevent the waterproofing agent that has permeated into the first split sheath portion and the second split sheath portion from being hindered from drying, and it is possible to reliably improve the waterproofing performance as desired.

(3) In (2) described above, it is preferable that the cover is a portion of the sheath. The cover can be formed by leaving a portion of the sheath that is to be removed to provide the shield member exposed portion. It is possible to efficiently provide the cover without any additional member.

(4) In (3) described above, it is preferable that the cover is tubular and is separated from the first split sheath portion and the second split sheath portion in the first direction. It is possible to provide a tubular cover by removing both end portions, in the lengthwise direction, of the sheath that covers the shield member exposed portion, and leaving the central portion thereof. As a result, it is possible to easily form the cover, and simplify the manufacturing process.

(5) In (3) described above, it is preferable that the cover is spiral and is wound around the electromagnetic shield member. The cover has a shape that can be spirally wound around the shield member exposed portion, and therefore the ratio of exposure of the shield member exposed portion can be relatively uniform in the lengthwise direction thereof. Therefore, it is possible to promote the dispersion of the waterproofing agent, and prevent the waterproofing agent from being hindered from drying as a result of the waterproofing agent being nonuniformly retained.

(6) In any one of (2) to (5) described above, it is preferable that the wire harness further includes a reinforcing member that is attached to the shielded electric wire, and the reinforcing member is provided along the first split sheath portion, and is more rigid than the shielded electric wire. The reinforcing member that is more rigid than the shielded electric wire is provided along the first split sheath portion. As a result, the first split sheath portion in which the waterproofing area is formed is prevented by the reinforcing member from being deformed and bent, and the waterproofing agent can be prevented from peeling off from the inner circumferential surface of the sheath or the outer circumferential surface of the first insulating coating when the shielded electric wire is deformed and bent. Thus, it is possible to improve the waterproofing performance of the wire harness.

Note that, if either one of the first split sheath portion and the second split sheath portion is prevented from being deformed and bent, using the reinforcing member, the waterproofing agent can be prevented from peeling off from the inner circumferential surface of the sheath and the outer circumferential surface of the first insulating coating at one position in the first direction of the shielded electric wire, and the waterproofing performance of the wire harness can be improved. The reinforcing member may have any shape as long as the reinforcing member can be provided along at least one of the first split sheath portion and the second split sheath portion, and any shape such as a plate shape, a rod shape, a tubular shape, or the like can be adopted.

(7) In (6) described above, it is preferable that the waterproofing agent is in tight contact with an inner circumferential surface of the second split sheath portion and the outer circumferential surface of the first insulating coating, and the reinforcing member is provided along both the first split sheath portion and the second split sheath portion. This is because the waterproofing agent applied to the shield member exposed portion permeates into the gap between the sheath of the second split sheath portion and the electromagnetic shield member, the gap between the electromagnetic shield member and the first coated electric wire are closed by the waterproofing agent, and the reinforcing member prevents both the second split sheath portion and the first split sheath portion in which waterproofing areas are formed from being deformed and bent. As a result, the waterproofing agent can be prevented from peeling off from the sheath and the first coated electric wire at two positions in the first direction of the shielded electric wire when the shielded electric wire is deformed and bent, and the waterproofing performance of the wire harness can be further improved.

Note that any shape may be adopted for the reinforcing member as long as the reinforcing member can be provided along both the first split sheath portion and the second split sheath portion. For example, the reinforcing member may include two members that are respectively provided along the first split sheath portion and the second split sheath portion, or one member that includes a portion that extends along both the first split sheath portion and the second split sheath portion of the shielded electric wire.

(8) In (6) or (7) described above, it is preferable that the reinforcing member extends over the first split sheath portion and the second split sheath portion in the first direction. This is because the reinforcing member that extends over the entire lengths of the first split sheath portion, the shield member exposed portion, a portion of which is covered by the cover, and the second split sheath portion prevents the entire permeation area of the waterproofing agent from being deformed and bent, in the first direction of the shielded electric wire. As a result, the waterproofing agent can be prevented from peeling off from the sheath and the first coated electric wire in the entire permeation area of the waterproofing agent provided in the intermediate portion of the shielded electric wire in the first direction when the shielded electric wire is deformed and bent, and the waterproofing performance of the wire harness can be further improved.

(9) In any one of (6) to (8) described above, it is preferable that the reinforcing member is tubular. This is because the reinforcing member improves the rigidity over the entire length of the shielded electric wire in the circumferential direction thereof and the shielded electric wire can be prevented from being deformed and bent, on the portion where the reinforcing member is overlaid. As a result, it is also possible to eliminate the orientation of the portion on which the reinforcing member is provided, for example, and improve the versatility of the reinforcing member. Note that the tubular reinforcing member that is made of metal or resin may be adopted. Also, the tubular reinforcing member may be of a type in which the tubular body can be split by a slit that extends in the axial direction of the reinforcing member.

(10) In any one of (6) to (9) described above, it is preferable that the wire harness further includes an exterior member that covers the shielded electric wire, and the reinforcing member is provided inside the exterior member. By directly overlaying and fixing the reinforcing member to the shielded electric wire, it is possible to provide the reinforcing member along a predetermined portion of the shielded electric wire (a portion of at least one of the first split sheath portion and the second split sheath portion, or, in addition to such a portion, the portion of the shield member exposed portion covered by the cover). As a result, it is possible to attach the reinforcing member without being affected by the assembly tolerance of the exterior member.

Furthermore, the reinforcing member will not be affected by the movement of the exterior member relative to the shielded electric wire, and therefore it is possible to improve the positional accuracy of the reinforcing member, and accordingly, it is possible to shorten the length of the reinforcing member in the first direction of the shielded electric wire. As a result, it is possible to prevent the flexibility of the wire harness from being unnecessarily impaired by the reinforcing member compared to the case where the reinforcing member is provided outside of the exterior member. In addition, it is possible to improve workability when the wire harness is connected to an onboard device, workability when the wire harness is to be attached to a vehicle, workability when the wire harness is to be routed, and so on.

(11) In any one of (6) to (9) described above, it is preferable that the wire harness further includes an exterior member that covers the shielded electric wire, and the reinforcing member is provided outside the exterior member. The reinforcing member can be provided outside the exterior member, and therefore the diameter of the exterior member can be reduced compared to the case in which the reinforcing member is provided inside the exterior member, and the wire harness can be downsized. Also, when the wire harness is connected to an onboard device or the wire harness is attached to a vehicle, it is easier for the operator to visually discern the portion where the reinforcing member is not present and can be easily deformed and bent, and the portion where the reinforcing member is present and cannot be easily deformed and bent. Therefore, it is possible to improve workability when the wire harness is connected to an onboard device, workability when the wire harness is to be attached to a vehicle, workability when the wire harness is to be routed, and so on compared to the case in which the reinforcing member is provided inside the exterior member.

(12) In (1) described above, it is preferable that the wire harness further includes a reinforcing member that is attached to the shielded electric wire, the sheath includes a first split sheath portion that is located on one side of the shield member exposed portion in a first direction that is a lengthwise direction of the shielded electric, the waterproofing agent is in tight contact with an inner circumferential surface of the first split sheath portion and an outer circumferential surface of the first insulating coating, and the reinforcing member is provided along the first split sheath portion, and is more rigid than the shielded electric wire. If the first split sheath portion is prevented from being deformed and bent, using the reinforcing member, the waterproofing agent can be prevented from peeling off from the inner circumferential surface of the sheath and the outer circumferential surface of the first insulating coating at one position in the first direction of the shielded electric wire, and the waterproofing performance of the wire harness can be improved.

DETAILS OF EMBODIMENTS OF THE PRESENT DISCLOSURE

Specific examples of a wire harness according to the present disclosure will be described below with reference to the drawings. It should be noted that the present disclosure is not limited to these examples, but is shown by the scope of claims and is intended to include all modifications within the meaning and scope equivalent to the scope of claims.

First Embodiment

Hereinafter, a first embodiment of the present disclosure will be described with reference to FIGS. 1 to 4. A wire harness 10 is used to electrically connect an inverter and a compressor of a vehicle to each other, for example. Specifically, the wire harness 10 is connected to an inverter-side connector (not shown) on the left side in FIG. 1, and to a compressor-side connector (not shown) on the right side in FIG. 1. In the drawings, the thicknesses of a binding tape 40, a binding member 62, and a reinforcing member 50, and the diameter of a shielded electric wire 12, and so on, which will be described later, are exaggerated to make these components more visible. Also, in the following description, the left side in FIG. 1 will be referred to as "front side", and the right side in FIG. 1 will be described as "rear side", but this orientation does not necessarily match the orientation of the wire harness 10 in the state in which it is attached to a vehicle. Furthermore, for a plurality of the same members, a reference numeral may be given to only some of the members, and the reference numeral may be omitted for the other members.

Wire Harness 10

Figure 1:
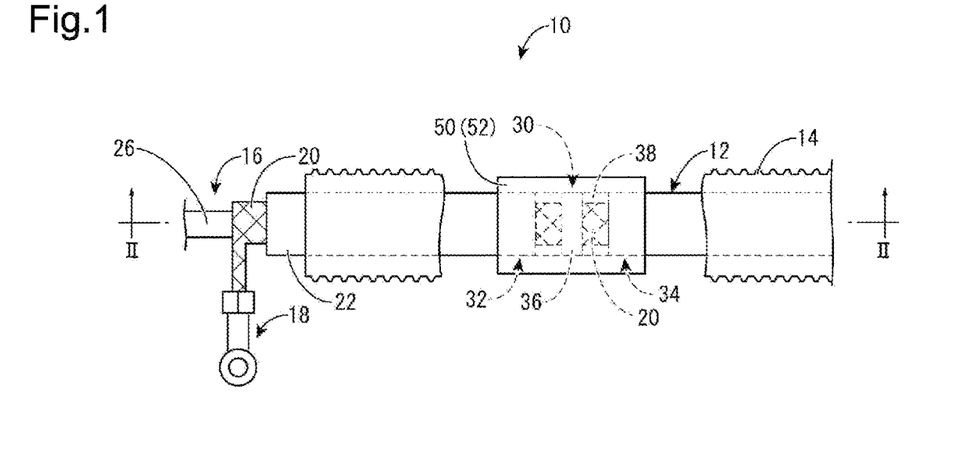
FIG. 1 is a front view showing a wire harness according to a first embodiment.

As shown in FIG. 1, the wire harness 10 includes a shielded electric wire 12 that is connected to an inverter-side connector and a compressor-side connector, and a grounding electric wire 18 that is electrically connected to an electromagnetic shield member 20, which will be described later, of the shielded electric wire 12. One end of the grounding electric wire 18 is electrically connected to one end portion (a front portion) of the electromagnetic shield member 20 described below, which is exposed to the outside by peeling off a sheath 22, which will be described later, of the shielded electric wire 12 over a certain length. The other end of the grounding electric wire 18 is grounded to a housing of a high-voltage component, a vehicle body panel, or the like, so that the electromagnetic shield member 20 is grounded. The shielded electric wire 12 is covered by a corrugated tube 14, which serves as an exterior member. In the first embodiment, one shielded electric wire 12 is provided. However, the number of shielded electric wires is not limited, and may be two or more.

Shielded Electric Wire 12

The shielded electric wire 12 includes a first coated electric wire 16, the electromagnetic shield member 20 that encloses the first coated electric wire 16 to electromagnetically shield the first coated electric wire 16, and the sheath 22 that is insulative and covers the electromagnetic shield member 20.

The first coated electric wire 16 includes a first core electric wire 24 that is a conductive metal core wire, and a first insulating coating 26 that covers the first core electric wire 24. The first insulating coating 26 may be formed in a tubular shape from a soft synthetic resin or the like, for example.

The electromagnetic shield member 20 is constituted by, for example, a tubular braided wire formed by braiding conductive thin metal wires. In an initial state before the grounding electric wire 18 is connected, the electromagnetic shield member 20 encloses the first coated electric wire 16 over substantially the entire length in the lengthwise direction thereof (the horizontal direction in FIG. 1). Note that the mode in which the thin metal wires are braided in the electromagnetic shield member 20 is not limited, and a conventionally known braided structure, braided or woven structure, or the like may be appropriately adopted.

The sheath 22 is a tubular member that is made of a soft synthetic resin, for example. In an initial state before the grounding electric wire 18 is connected to the electromagnetic shield member 20, the sheath 22 encloses the first coated electric wire 16 and the electromagnetic shield member 20 over substantially their entire length in the lengthwise direction.

Shield Member Exposed Portion 30, First Split Sheath Portion 32, and Second Split Sheath Portion 34

Figure 2:
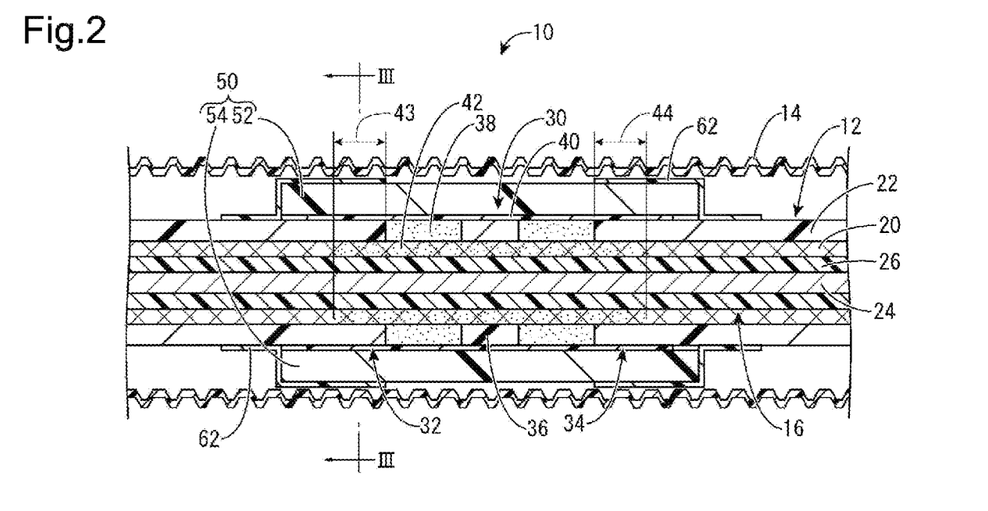
FIG. 2 is an enlarged cross-sectional view taken along II-II in FIG. 1.
Figure 4:
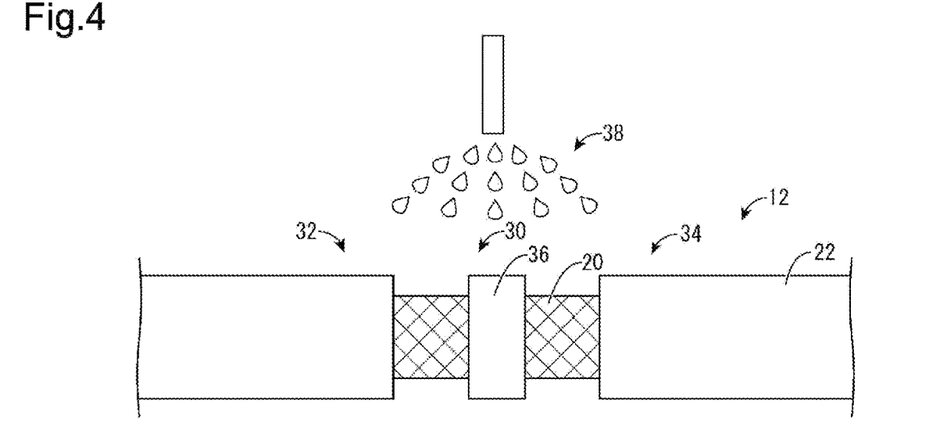
FIG. 4 is an enlarged front view for illustrating a process in which a waterproofing agent is applied to the wire harness shown in FIG. 1.

As shown in FIGS. 1, 2 and 4, an intermediate portion of the shielded electric wire 12 in a first direction that is the lengthwise direction of the shielded electric wire 12 (the horizontal direction in FIGS. 1, 2 and 4) is provided with a shield member exposed portion 30 from which the sheath 22 is removed and the electromagnetic shield member 20 is exposed to the outside. Note that the intermediate portion in the first direction is any portion between the two ends in the first direction, other than the two ends. In the first direction, a first split sheath portion 32 is located on the front side (the left side in FIGS. 1, 2, and 4), which is one side in the first direction of the shield member exposed portion 30, and a second split sheath portion 34 is located on the rear side (the right side in FIGS. 1, 2, and 4), which is the other side in the first direction of the shield member exposed portion 30.

Cover 36

More specifically, in the shielded electric wire 12, the sheath 22 is removed from two areas that are separate from each other in an intermediate portion of the shielded electric wire 12 in the first direction (the horizontal direction in FIGS. 1, 2, and 4) so that the electromagnetic shield member 20 is exposed to the outside. The two areas of the intermediate portion are separated from each other in the lengthwise direction thereof, and therefore a portion of the sheath 22 remains between the two areas of the intermediate portion without being removed therefrom. This remaining portion of the sheath 22 constitutes a cover 36. That is to say, the cover 36 is a portion of the sheath 22. Therefore, it is possible to efficiently provide the cover 36 without any additional member. That is to say, it is possible to simplify the manufacturing process.

In short, a central portion of the shield member exposed portion 30 in the lengthwise direction thereof is partially covered by the insulating cover 36. Also, the electromagnetic shield member 20 is exposed to the outside at portions located on the two sides of the cover 36 in the lengthwise direction of the shield member exposed portion 30. The cover 36 is tubular and is located between the first split sheath portion 32 and the second split sheath portion 34 in the first direction of the shielded electric wire 12. In addition, the cover 36 is located at a position separated from the first split sheath portion 32 and the second split sheath portion 34 in the first direction of the shielded electric wire 12.

Waterproofing Agent 38

As shown in FIG. 4, a waterproofing agent 38 is applied to the shield member exposed portion 30. That is to say, the waterproofing agent 38 is applied to the shield member exposed portion 30 that is not covered by the cover 36. For example, a silicone resin, silicone rubber, grease, butyl rubber, an epoxy resin, an acrylic resin, a thermoplastic resin, or another adhesive that has viscosity and elasticity may be used as the waterproofing agent 38. In the present embodiment, a silicone resin that solidifies when dried is used. As shown in FIG. 2, a piece of binding tape 40 such as vinyl tape is wound around the entire shield member exposed portion 30 and the end portions of the first split sheath portion 32 and the second split sheath portion 34 on the shield member exposed portion 30 side. As a result, the applied waterproofing agent 38 is stably held between the first coated electric wire 16 in the shield member exposed portion 30 and the piece of binding tape 40.

First Waterproofing Area 43 and Second Waterproofing Area 44

As shown in FIG. 2, the waterproofing agent 38 applied to the portion of the shield member exposed portion 30 not covered by the cover 36 permeates into first gaps 42 between the thin metal wires in the electromagnetic shield member 20. The waterproofing agent 38 further penetrates through the first gaps 42 in both directions in the lengthwise direction of the first gaps 42 to form a first waterproofing area 43 and a second waterproofing area 44 at the respective ends of the first split sheath portion 32 and the second split sheath portion 34 on the shield member exposed portion 30 side. That is to say, the first split sheath portion 32 is constituted by a portion of the sheath 22 located so as to cover the area where the waterproofing agent 38 permeates through the electromagnetic shield member 20 (the first waterproofing area 43) on the front side, which is one side in the lengthwise direction of the shield member exposed portion 30. Also, the second split sheath portion 34 is constituted by a portion of the sheath 22 located so as to cover the area where the waterproofing agent 38 permeates through the electromagnetic shield member 20 (the second waterproofing area 44) on the rear side, which is the other side in the lengthwise direction of the shield member exposed portion 30.

Figure 3:
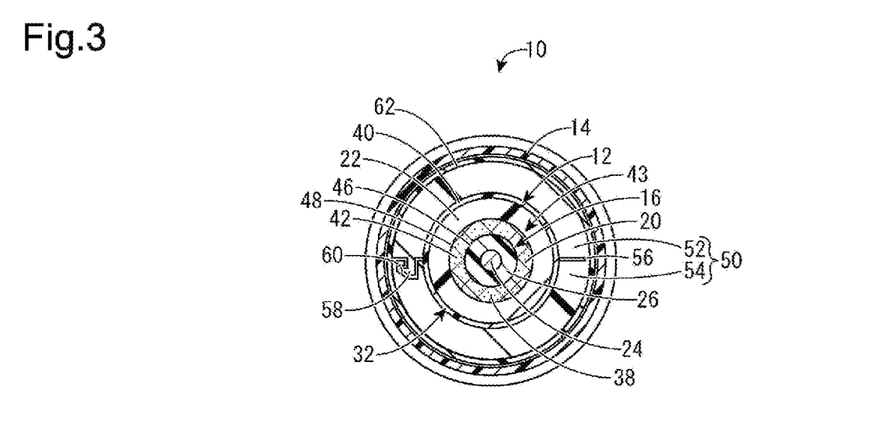
FIG. 3 is a cross-sectional view taken along in FIG. 2.

In the present embodiment, the piece of binding tape 40 is wound around the shield member exposed portion 30 to which the waterproofing agent 38 is applied and the vicinity thereof, and therefore, a force is applied to the waterproofing agent 38 in a direction toward the first coated electric wire 16. As a result, the waterproofing agent 38 is promoted to permeate into the electromagnetic shield member 20 in the shield member exposed portion 30, the first waterproofing area 43, and the second waterproofing area 44. As a result, as shown in FIG. 3, the waterproofing agent 38 is in tight contact with the inner circumferential surface of the first split sheath portion 32 and the outer circumferential surface of the first insulating coating 26 of the first coated electric wire 16 in the first waterproofing area 43. Similarly, the waterproofing agent 38 is in tight contact with the inner circumferential surface of the second split sheath portion 34 and the outer circumferential surface of the first insulating coating 26 of the first coated electric wire 16 in the second waterproofing area 44. More specifically, in the first waterproofing area 43 and the second waterproofing area 44, the first gaps 42 between the thin metal wires in the electromagnetic shield member 20, a second gap 46 between the electromagnetic shield member 20 and the first coated electric wire 16, and a third gap 48 between the sheath 22 and the electromagnetic shield member 20 are filled with the waterproofing agent 38 so as to be waterproof. As described above, the sheath 22 is peeled off from one end portion (a front portion) of the shielded electric wire 12 so that the electromagnetic shield member 20 is exposed to the outside (see FIG. 1). Therefore, when one end side of the shielded electric wire 12 gets wet with water, water may permeate through the first gaps 42, the second gap 46, and the third gap 48 formed between the sheath 22 and the first coated electric wire 16, and enter a device provided on the other end portion side (the rear side) of the shielded electric wire 12 such as a connector (not shown). As shown in FIG. 2, the first waterproofing area 43 and the second waterproofing area 44 are provided to prevent such entrance of water at two positions in the first direction of the shielded electric wire 12.

Reinforcing Member 50

As shown in FIG. 2, the shielded electric wire 12 is provided with a reinforcing member 50 that extends over the entire lengths of the first split sheath portion 32, the shield member exposed portion 30, and the second split sheath portion 34, in the first direction (the horizontal direction in FIG. 2) of the shielded electric wire 12. That is to say, the reinforcing member 50 is provided along both the first split sheath portion 32 and the second split sheath portion 34. More specifically, the reinforcing member 50 has a cylindrical shape that extends along the shielded electric wire 12 and is open in the front-rear direction (see FIG. 3). The reinforcing member 50 is made of a synthetic resin that is more rigid than the shielded electric wire 12. The reinforcing member 50 has a tubular shape as a whole, and covers the first waterproofing area 43, the shield member exposed portion 30, and the second waterproofing area 44.

As shown in FIGS. 2 and 3, the reinforcing member 50 includes an upper split tubular body 52 and a lower split tubular body 54, and is attached to the outer circumferential surface of the shielded electric wire 12. The upper split tubular body 52 and the lower split tubular body 54 are constituted by the upper split tubular body 52 located on the upper side (the upper side in FIGS. 2 and 3) and the lower split tubular body 54 located on the lower side (the lower side in FIGS. 2 and 3). The upper split tubular body 52 and the lower split tubular body 54 are each a half tube that has a semi-circular cross section and extends in an axial direction. The upper split tubular body 52 and the lower split tubular body 54 are combined with each other from above and below, so that the first waterproofing area 43 and the second waterproofing area 44 of the shielded electric wire 12 are sandwiched therebetween.

In addition, as shown in FIG. 3, the upper split tubular body 52 and the lower split tubular body 54 are coupled to each other using a hinge portion 56 that is thin at one end (the right end in FIG. 3) in the circumferential direction thereof. A locking projection 58 provided at the other end (the left end in FIG. 3) of the upper split tubular body 52 in the circumferential direction thereof is locked to a lock-target recess 60 provided at the other end of the lower split tubular body 54 in the circumferential direction thereof, and thus the respective other ends of the upper split tubular body 52 and the lower split tubular body 54 in the circumferential direction thereof are locked to each other. As shown in FIG. 2, both ends of the reinforcing member 50 in the lengthwise direction thereof are fixed to the outer circumferential surface of the shielded electric wire 12, using a binding member 62 such as a piece of binding tape. By adopting the reinforcing member 50 that includes the upper split tubular body 52 and the lower split tubular body 54 in this way, it is possible to improve assembling workability compared to when an unsplit tubular body is used, for example. Here, the reinforcing member 50 is made of a synthetic resin that is more rigid than the shielded electric wire 12, and therefore the rigidity of the shielded electric wire 12 is improved by the reinforcing member 50, and the shielded electric wire 12 can be prevented from being deformed and bent.

Corrugated Tube 14

The corrugated tube 14 that is made of a synthetic resin and has a cylindrical shape is additionally attached to the shielded electric wire 12 thus formed. That is to say, the reinforcing member 50 is provided inside the corrugated tube 14. Note that both ends of the corrugated tube 14 in the lengthwise direction thereof are fixed to the shielded electric wire 12, using a binding member such as a piece of binding tape (not shown).

Method for Manufacturing Wire Harness 10

A method for manufacturing the wire harness 10 will be described with reference to FIGS. 1 to 4. First, a shielded electric wire 12 cut to a desired length is prepared. Next, as shown in FIG. 4, the shield member exposed portion 30 that exposes the electromagnetic shield member 20 to the outside is provided by removing a portion of the sheath 22 over a predetermined length in an intermediate portion, with respect to the first direction, of the shielded electric wire 12. In the present embodiment, the cover 36 constituted by the portion of the sheath 22 left unremoved is provided on a central portion, with respect to the lengthwise direction, of the shield member exposed portion 30. Subsequently, the waterproofing agent 38, which is liquid, is applied to the shield member exposed portion 30 from above. Next, the piece of binding tape 40 such as vinyl tape is wound around the entire shield member exposed portion 30 and the end portions of the first split sheath portion 32 and the second split sheath portion 34 on the shield member exposed portion 30 side. As a result, as shown in FIG. 2, the applied waterproofing agent 38 is stably held between the first coated electric wire 16 in the shield member exposed portion 30 and the piece of binding tape 40. Subsequently, an intermediate portion of the shielded electric wire 12 (including the shield member exposed portion 30) is placed inside the lower split tubular body 54 with the inner side of the lower split tubular body 54 of the reinforcing member 50 facing upward. Next, the locking projection 58 of the upper split tubular body 52 of the reinforcing member 50 is lock-fitted into the lock-target recess 60 of the lower split tubular body 54. As a result, the reinforcing member 50 is attached, covering the intermediate portion of the shielded electric wire 12. Thereafter, both ends of the reinforcing member 50 in the lengthwise direction thereof are fixed to the shielded electric wire 12, using a binding member 62 such as a piece of binding tape.

The waterproofing agent 38 does not solidify and maintains its fluidity during the manufacture of the wire harness 10. Therefore, in the shield member exposed portion 30, the applied waterproofing agent 38 permeates from the outer circumferential surface of the electromagnetic shield member 20 into the first gaps 42 between the thin metal wires in the electromagnetic shield member 20. The waterproofing agent 38 further penetrates through the first gaps 42 in both directions in the lengthwise direction of the first gaps 42 forms the first waterproofing area 43 and the second waterproofing area 44 at the respective ends of the first split sheath portion 32 and the second split sheath portion 34 on the shield member exposed portion 30 side. As a result, in the first waterproofing area 43 and the second waterproofing area 44, the first gaps 42 in the electromagnetic shield member 20, the second gap 46 between the electromagnetic shield member 20 and the first coated electric wire 16, and the third gap 48 between the sheath 22 and the electromagnetic shield member 20 are filled with the waterproofing agent 38.

Next, the shielded electric wire 12 is enclosed by the corrugated tube 14, and both ends of the corrugated tube 14 in the lengthwise direction thereof are fixed to the shielded electric wire 12, using a binding member (not shown). Finally, the grounding electric wire 18 and the electromagnetic shield member 20 are connected to each other at an end of the shielded electric wire 12 (on the left side in FIG. 1). The wire harness 10 with this configuration is dried for a certain period of time, solidifying the waterproofing agent 38. Thus, the wire harness 10 according to the first embodiment of the present disclosure is complete.

In the wire harness 10 according to the present disclosure with this configuration, the shield member exposed portion 30 is provided in an intermediate portion, with respect to the first direction, of the shielded electric wire 12, and a portion of the shield member exposed portion 30 is covered by the cover 36. The waterproofing agent 38 is applied to the shield member exposed portion 30 when it is not covered by the cover 36. Therefore, the amount of the waterproofing agent 38 that is to be applied to the shield member exposed portion 30 can be reduced by the amount corresponding to the area covered by the cover 36. That is to say, the amount of the waterproofing agent 38 that permeates into the first waterproofing area 43 and the second waterproofing area 44 of the first split sheath portion 32 and the second split sheath portion 34 can be controlled to an appropriate amount by controlling the size of the area covered by the cover 36. As a result, the waterproofing agent 38 that has permeated through the first waterproofing area 43 and the second waterproofing area 44 can be dried at an early stage. That is to say, the waterproofing agent 38 can be prevented from permeating into the sheath 22, and from being hindered from drying in the areas where the waterproofing agent 38 is in tight contact with the inner circumferential surface of the sheath 22 and the outer circumferential surface of the first insulating coating 26 (the first waterproofing area 43 and the second waterproofing area 44). As a result of the waterproofing agent 38 being dried as desired, a state in which the waterproofing agent 38 is in tight contact with the inner circumferential surface of the sheath 22 and the outer circumferential surface of the first insulating coating 26 is desirably maintained in the areas where the waterproofing agent 38 is in tight contact with the inner circumferential surface of the sheath 22 and the outer circumferential surface of the first insulating coating 26 (the first waterproofing area 43 and the second waterproofing area 44). Therefore, it is possible to improve the waterproofing performance of the waterproofing agent 38, and stably form a wire harness 10 with the desired waterproofing performance. Also, it is possible to prevent the waterproofing agent 38 from being excessively applied to the shield member exposed portion 30, and therefore it is possible to realize desirable drying of the waterproofing agent 38 in the first waterproofing area 43 and the second waterproofing area 44 at an early stage. In addition, since it is possible to realize drying of the waterproofing agent 38 at an early stage, it is also possible to reduce the manufacturing costs of the wire harness 10.

Furthermore, the cover 36 is located between the first split sheath portion 32 and the second split sheath portion 34 in the first direction of the cover 36, and therefore the waterproofing agent 38 can be distributed to both the first split sheath portion 32 and the second split sheath portion 34. In addition, the waterproofing agent 38 is in tight contact with the inner circumferential surface of the first split sheath portion 32 and the outer circumferential surface of the first insulating coating 26, and therefore water can be stopped on the first split sheath portion 32 side. The waterproofing agent 38 may also be in tight contact with the inner circumferential surface of the second split sheath portion 34 and the outer circumferential surface of the first insulating coating 26 in the second split sheath portion 34 in order to realize waterproofing. The amount of the waterproofing agent 38 that permeates into the first split sheath portion 32 and the second split sheath portion 34 can be controlled to an appropriate amount by controlling the size of the area covered by the cover 36. As a result, it is possible to prevent the waterproofing agent 38 that has permeated into the first split sheath portion 32 and the second split sheath portion 34 from being hindered from drying, and it is possible to reliably improve the waterproofing performance as desired.

In the present embodiment, the reinforcing member 50 is made of a synthetic resin that is more rigid than the shielded electric wire 12. Therefore, the rigidity of the shielded electric wire 12 is improved by the reinforcing member 50, and the shielded electric wire 12 can be prevented from being deformed and bent. In addition, the reinforcing member 50 extends over the entire lengths of the first split sheath portion 32, the shield member exposed portion 30, and the second split sheath portion 34. That is to say, the reinforcing member 50 prevents the entire permeation area, through which the waterproofing agent 38 has permeated, from being deformed and bent. As a result, in the entire permeation area (the area in which the first waterproofing area 43, the second waterproofing area 44, and the electromagnetic shield member 20 are exposed to the outside), the solidified waterproofing agent 38 can be prevented from peeling off from the inner circumferential surface of the sheath 22, the outer circumferential surface of the first insulating coating 26 of the first coated electric wire 16, or the electromagnetic shield member 20. Therefore, it is possible to prevent the first gaps 42, the second gap 46, and the third gap 48 from being formed again, and therefore it is possible to further improve the waterproofing property of the wire harness 10 according to the present disclosure. Moreover, the reinforcing member 50 is tubular. Therefore, it is also possible to eliminate the directionality of the portion on which the reinforcing member 50 is provided, for example, and improve the versatility of the reinforcing member 50.

In addition, the reinforcing member 50 is provided directly along predetermined portions (the first split sheath portion 32, the shield member exposed portion 30, and the second split sheath portion 34) of the shielded electric wire 12. As a result, it is possible to attach the reinforcing member 50 without being affected by the assembly tolerance of the corrugated tube 14 with respect to the shielded electric wire 12. Therefore, it is possible to precisely position the reinforcing member 50 on the shielded electric wire 12. Therefore, it is also possible to shorten the length of the reinforcing member 50 in the first direction of the shielded electric wire 12. As a result, it is possible to prevent the flexibility of the wire harness 10 from being unnecessarily impaired by the reinforcing member compared to the case where the reinforcing member is provided outside of the corrugated tube 14. Therefore, it is possible to improve workability when the wire harness 10 is connected to an onboard device (not shown), workability when the wire harness 10 is to be attached to a vehicle (not shown), workability when the wire harness 10 is to be routed, and so on.

Other Embodiments

The techniques described herein are not limited to the embodiments described above and in the drawings, and for example, the following embodiments are also included in the technical scope of the techniques described herein.

Figure 5:
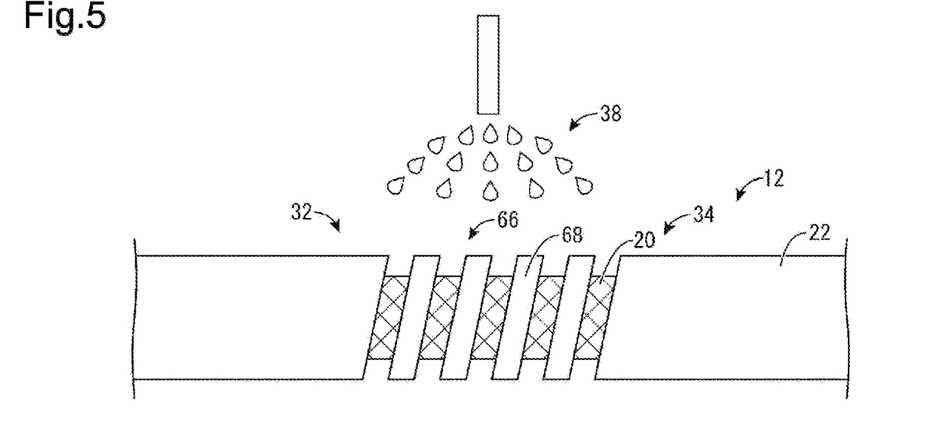
FIG. 5 is a front view for illustrating a process in which a waterproofing agent is applied to a wire harness according to a second embodiment, and is a diagram corresponding to FIG. 4.
Figure 6:
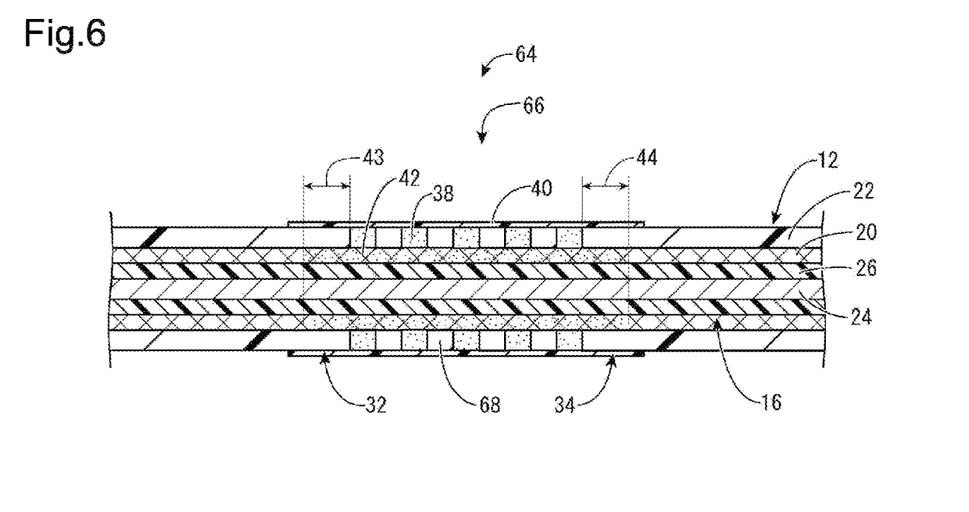
FIG. 6 is a cross-sectional view showing the wire harness according to the second embodiment, and is a diagram corresponding to FIG. 2.

(1) In the above-described first embodiment, two portions of the sheath 22 that are separated from each other in the first direction are removed from the intermediate portion of the shielded electric wire 12 in the first direction, and the remaining portion of the sheath 22 between the two portions constitutes the cover 36. However, the present invention is not limited to such a configuration. As in a wire harness 64 according to the second embodiment of the present disclosure shown in FIGS. 5 and 6, in a shield member exposed portion 66, a cover 68 may have a shape that can be spirally wound around the shield member exposed portion 66. More specifically, the cover 68 is formed by spirally removing a portion of the sheath 22 from the intermediate portion of the shielded electric wire 12 in the first direction. The cover 68 has a spiral shape and is wound around the shield member exposed portion 66, and therefore, in the shield member exposed portion 66, the ratio of the portions of the electromagnetic shield member 20 exposed to the outside can be relatively uniform along its lengthwise direction. Therefore, the waterproofing agent 38 applied to the electromagnetic shield member 20 can also be uniform in the lengthwise direction of the electromagnetic shield member 20. Therefore, it is possible to prevent the waterproofing agent 38 from being hindered from drying as a result of the waterproofing agent 38 being nonuniformly retained. Note that, as shown in FIG. 6, in the wire harness 64 according to the second embodiment, the reinforcing member 50 and the corrugated tube 14 provided in the first embodiment are not provided. In this way, the reinforcing member 50 and the corrugated tube 14 are optional, and do not necessarily have to be provided in the above first embodiment and so on.

Figure 7:
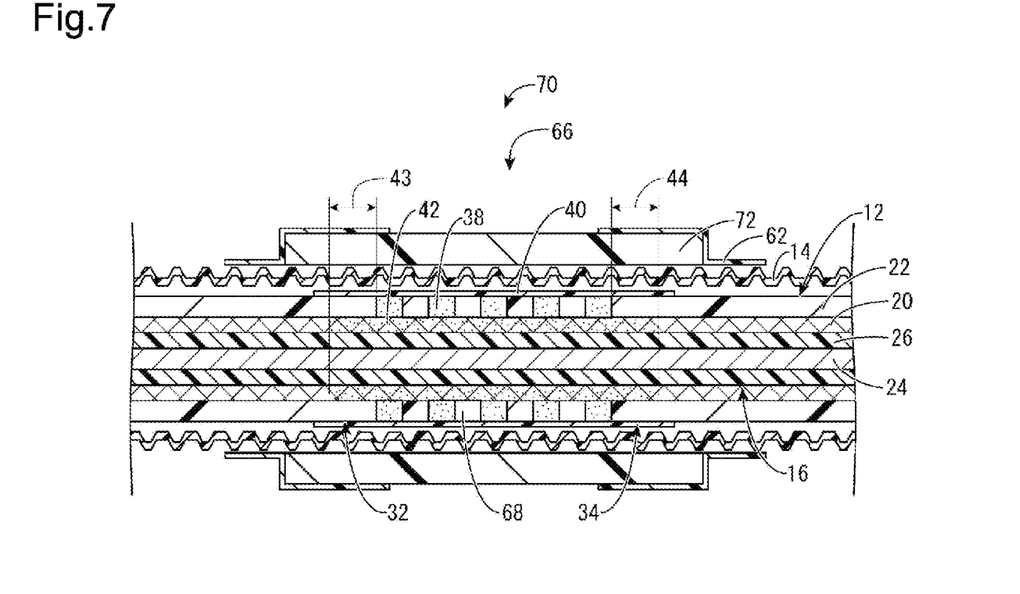
FIG. 7 is a cross-sectional view showing a wire harness according to a third embodiment, and is a diagram corresponding to FIG. 2.

(2) In the above-described first embodiment, the reinforcing member 50 is provided inside the corrugated tube 14. However, the present invention is not limited to such a configuration. As in a wire harness 70 according to a third embodiment of the present disclosure shown in FIG. 7, a reinforcing member 72 may be provided outside the corrugated tube 14 that serves as an exterior member. With such a configuration, the diameter of the corrugated tube 14 can be reduced compared to the case in which the reinforcing member is provided inside the corrugated tube 14. Therefore, it is possible to downsize the wire harness 70. Also, since the reinforcing member 72 is provided outside the corrugated tube 14, it is easier for the operator to visually discern the portion where the reinforcing member 72 is not present and the corrugated tube 14 can be easily deformed and bent, and the portion where the reinforcing member 72 is present and the corrugated tube 14 cannot be easily deformed and bent. Therefore, it is possible to improve workability when the wire harness 70 is connected to an onboard device, workability when the wire harness 70 is attached to a vehicle, workability when the wire harness 70 is routed, and so on compared to the case in which the reinforcing member is provided inside the corrugated tube 14.

Figure 8:
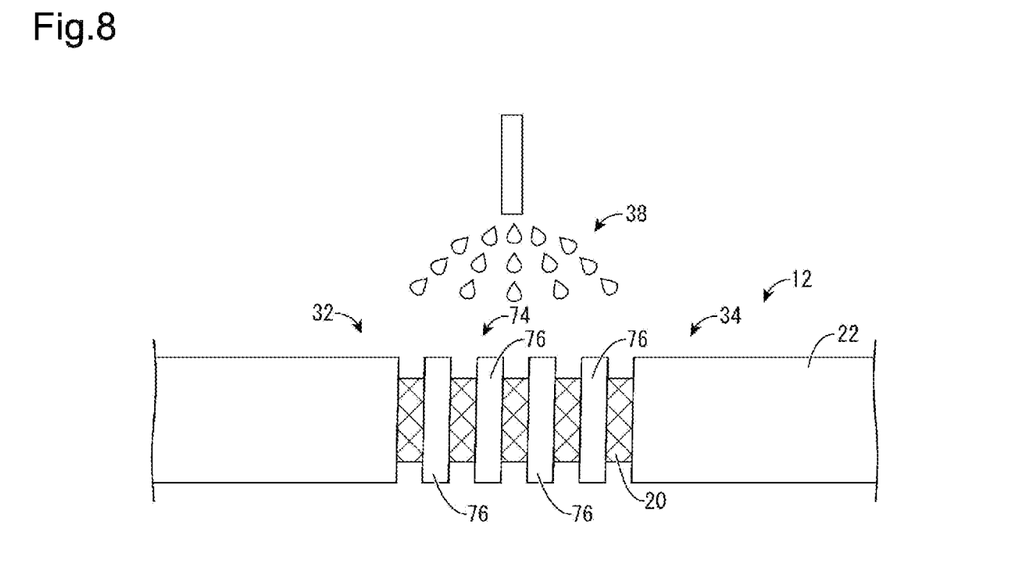
FIG. 8 is a front view for illustrating a process in which a waterproofing agent is applied to a wire harness according to a fourth embodiment, and is a diagram corresponding to FIG. 4.

(3) In the above-described second embodiment, the cover 68 has a shape that can be spirally wound around the shield member exposed portion 66. However, the present invention is not limited to such a configuration. As with a shield member exposed portion 74 according to a fourth embodiment of the present disclosure shown in FIG. 8, covers 76 each having a cylindrical shape may be provided at four positions that are separated from each other in the lengthwise direction of the shield member exposed portion 66. More specifically, these covers 76 are formed by removing portions of the sheath 22 at five positions that are separated from each other in the first direction of an intermediate portion in the first direction of the shielded electric wire 12. In the fourth embodiment, in the shield member exposed portion 74, the ratio of the portions of the electromagnetic shield member 20 exposed to the outside can be relatively uniform in the lengthwise direction thereof. Therefore, as in the above-described second and third embodiments, it is possible to prevent the waterproofing agent 38 from being hindered from drying as a result of the waterproofing agent 38 being nonuniformly retained.

Figure 9:
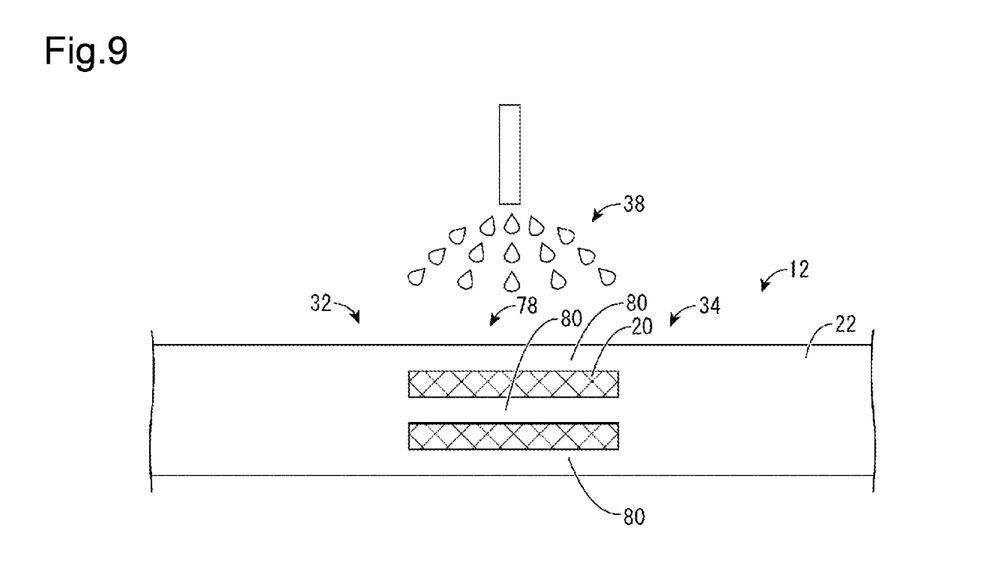
FIG. 9 is a front view for illustrating a process in which a waterproofing agent is applied to a wire harness according to a fifth embodiment, and is a diagram corresponding to FIG. 4.

(4) As in a shield member exposed portion 78 according to a fifth embodiment of the present disclosure shown in FIG. 9, covers 80 may be provided at four positions that are separated from each other in the circumferential direction of the shield member exposed portion 78 so that each cover 80 has a strip shape that extends in the lengthwise direction thereof. In the fifth embodiment, in the shield member exposed portion 78, the ratio of the portions of the electromagnetic shield member 20 exposed to the outside can be relatively uniform in the lengthwise direction thereof. Therefore, as in the above-described second to fourth embodiments, it is possible to prevent the waterproofing agent 38 from being hindered from drying as a result of the waterproofing agent 38 being nonuniformly retained. Note that, regarding the configuration of the cover, any shape may be adopted as long as the cover is separated in the lengthwise direction or the circumferential direction of the shield member exposed portion.

(5) The piece of binding tape 40 wound around the shield member exposed portion 30 to which the waterproofing agent 38 has been applied and the ends of the first split sheath portion 32 and the second split sheath portion 34 on the shield member exposed portion 30 side is optional, and does not necessarily have to be provided. Also, a piece of binding tape, a cable tie, or another well-known binding member may be used as the binding member 62 for fixing the reinforcing member 50 or 72 to the shielded electric wire 12 and the corrugated tube 14.

(6) In the above-described first to fifth embodiments, the covers 36, 68, 76, and 80 are constituted by the sheath 22, but they may also be constituted by a piece of binding tape such as vinyl tape, a cable tie such as a rubber band, or the like, instead of the sheath 22.

(7) In the above-described first embodiment, the reinforcing member 50 extends over the entire lengths of the first split sheath portion 32, the shield member exposed portion 30, and the second split sheath portion 34. However, the present invention is not limited to such a configuration. The reinforcing member 50 may also be provided along only the first split sheath portion 32 and the second split sheath portion 34. With such a configuration, the reinforcing member 50 prevents the first waterproofing area 43 and the second waterproofing area 44 located on the two sides of the shield member exposed portion 30 from being deformed and bent. Therefore, it is possible to prevent the waterproofing agent 38 from peeling off from the inner circumferential surface of the sheath 22, the outer circumferential surface of the first insulating coating 26 of the first coated electric wire 16, or the electromagnetic shield member 20 due to the shielded electric wire 12 being deformed and bent, at two positions in the first direction of the shielded electric wire 12. Therefore, it is possible to sufficiently improve the waterproofing property of the wire harness 10. Note that any shape may be adopted for the reinforcing member 50 as long as the reinforcing member 50 can be provided along both the first split sheath portion 32 and the second split sheath portion 34. For example, the reinforcing member 50 may include two members that are respectively provided along the first split sheath portion 32 and the second split sheath portion 34, or one member that includes a portion that extends along both the first split sheath portion 32 and the second split sheath portion 34 of the shielded electric wire 12.

(8) In the above-described first embodiment, the reinforcing member 50 extends over the entire lengths of the first split sheath portion 32, the shield member exposed portion 30, and the second split sheath portion 34. However, the present invention is not limited to such a configuration. The reinforcing member 50 may also be provided along only one of the first split sheath portion 32 and the second split sheath portion 34. With this configuration, the reinforcing member 50 prevents only one of the first waterproofing area 43 and the second waterproofing area 44 from being deformed and bent. Therefore, the waterproofing agent 38 can be prevented from peeling off from the inner circumferential surface of the sheath 22, the outer circumferential surface of the first insulating coating 26 of the first coated electric wire 16, and the electromagnetic shield member 20 when the shielded electric wire 12 is deformed to be formed, only in one of the first waterproofing area 43 and the second waterproofing area 44. Therefore, even in such a case, it is possible to realize the waterproofing performance of the wire harness 10. Note that the reinforcing member 50 may have any shape as long as the reinforcing member 50 can be provided along at least one of the first split sheath portion 32 and the second split sheath portion 34, and any shape such as a plate shape, a rod shape, a square tube shape, or the like can be adopted. Also, in the above-described first embodiment, the reinforcing member 50 may have any shape as long as the reinforcing member 50 can prevent the shielded electric wire 12 from being deformed and bent, and any shape such as a plate shape, a rod shape, a square tube shape, or the like can be adopted. For example, it is possible to provide a reinforcing member that has a plate shape or a rod shape only on the side where the shielded electric wire 12 may be deformed and bent. Note that the first split sheath portion may be provided on the front side or the rear side with respect to the shield member exposed portion. That is to say, one side with respect to the shield member exposed portion is not limited to the front side of the shield member exposed portion.

(9) In the above-described first embodiment, the reinforcing member 50 is made of a synthetic resin that is more rigid than the shielded electric wire 12. However, the present invention is not limited to such a configuration, and a metal reinforcing member that is more rigid than the shielded electric wire 12 may be adopted.

REFERENCE SIGNS LIST

10 Wire Harness (First Embodiment)
12 Shielded Electric Wire
14 Corrugated Tube (Exterior Member)
16 First Coated Electric Wire
18 Grounding Electric Wire
20 Electromagnetic Shield Member
22 Sheath
24 First Core Electric Wire (Core Wire)
26 First Insulating Coating
30 Shield Member Exposed Portion
32 First Split Sheath Portion
34 Second Split Sheath Portion
36 Cover
38 Waterproofing Agent
40 Binding Tape
42 First Gaps
43 First Waterproofing Area (Waterproofing Area)
44 Second Waterproofing Area (Waterproofing Area)
46 Second Gap
48 Third Gap 50 Reinforcing Member
52 Upper Split Tubular body (Split Tubular body)
54 Lower Split Tubular body (Split Tubular body)
56 Hinge Portion
58 Locking Protrusion
60 Lock-target Recess
62 Binding Member
64 Wire Harness (Second Embodiment)
66 Shield Member Exposed Portion
68 Cover
70 Wire Harness (Third Embodiment)
72 Reinforcing Member
74 Shield Member Exposed Portion (Fourth Embodiment)
76 Cover
78 Shield Member Exposed Portion (Fifth Embodiment)
80 Cover

The invention claimed is:

1. A wire harness, comprising:
a shielded electric wire that includes a first coated electric wire that includes a first core electric wire and a first insulating coating that covers the first core electric wire, an electromagnetic shield member that covers the first coated electric wire, a sheath that covers the electromagnetic shield member, and a shield member exposed portion from which the sheath is removed and the electromagnetic shield member is exposed;
an insulating cover that covers a portion of the shield member exposed portion; and
a waterproofing agent applied to the shield member exposed portion and permeated into the electromagnetic shield member,
wherein the waterproofing agent is in tight contact with an inner circumferential surface of an end portion of the sheath on the shield member exposed portion side and an outer circumferential surface of the first insulating coating so that a waterproofing area is formed,
wherein the sheath includes a first split sheath portion that is located on one side of the shield member exposed portion in a first direction that is a lengthwise direction of the shielded electric wire, and a second split sheath portion that is located on an other side of the electromagnetic shield member,
the insulating cover is a portion of the sheath made by partially cutting away the sheath,
the insulating cover is located between the first split sheath portion and the second split sheath portion in the first direction, and
the insulating cover is tubular and is separated from first split sheath portion and the second split sheath portion in the first direction.

2. The wire harness according to claim 1,
wherein
the waterproofing agent is in tight contact with an inner circumferential surface of the first split sheath portion and the outer circumferential surface of the first insulating coating.

3. The wire harness according to claim 1,
wherein the insulating cover is spiral and is wound around the electromagnetic shield member.

4. The wire harness according to claim 1, further comprising:
a reinforcing member that is attached to the shielded electric wire,
wherein the reinforcing member is provided along the first split sheath portion, and is more rigid than the shielded electric wire.

5. The wire harness according to claim 4,
wherein the waterproofing agent is in tight contact with an inner circumferential surface of the second split sheath portion and the outer circumferential surface of the first insulating coating, and
the reinforcing member is provided along both the first split sheath portion and the second split sheath portion.

6. The wire harness according to claim 4,
wherein the reinforcing member extends over the first split sheath portion and the second split sheath portion in the first direction.

7. The wire harness according to claim 4,
wherein the reinforcing member is tubular.

8. The wire harness according to claim 4, further comprising:
an exterior member that covers the shielded electric wire,
wherein the reinforcing member is provided inside the exterior member.

9. The wire harness according to claim 4, further comprising:
an exterior member that covers the shielded electric wire,
wherein the reinforcing member is provided outside the exterior member.

10. The wire harness according to claim 1, further comprising:
a reinforcing member that is attached to the shielded electric wire,
wherein
the waterproofing agent is in tight contact with an inner circumferential surface of the first split sheath portion and an outer circumferential surface of the first insulating coating, and
the reinforcing member is provided along the first split sheath portion, and is more rigid than the shielded electric wire.

11. A wire harness, comprising:
a shielded electric wire that includes a first coated electric wire that includes a first core electric wire and a first insulating coating that covers the first core electric wire, an electromagnetic shield member that covers the first coated electric wire, a sheath that covers the electromagnetic shield member, and a shield member exposed portion from which the sheath is removed and the electromagnetic shield member is exposed;
an insulating cover that covers a portion of the shield member exposed portion;
a waterproofing agent applied to the shield member exposed portion and permeated into the electromagnetic shield member,
a reinforcing member that is attached to the shielded electric wire, and
an exterior member that covers the shielded electric wire,
wherein the waterproofing agent is in tight contact with an inner circumferential surface of an end portion of the sheath on the shield member exposed portion side and an outer circumferential surface of the first insulating coating so that a waterproofing area is formed,
the insulating cover is a portion of the sheath made by partially cutting away the sheath,
the sheath includes a first split sheath portion that is located on one side of the shield member exposed portion in a first direction that is a lengthwise direction of the shielded electric wire,
the insulating cover is separated from the first split sheath portion in the first direction, the reinforcing member is provided along the first split sheath portion, and is more rigid than the shielded electric wire, and the reinforcing member is provided outside the exterior member.

12. A wire harness, comprising:

a shielded electric wire that includes a first coated electric wire that includes a first core electric wire and a first insulating coating that covers the first core electric wire, an electromagnetic shield member that covers the first coated electric wire, a sheath that covers the electromagnetic shield member, and a shield member exposed portion from which the sheath is removed and the electromagnetic shield member is exposed;

an insulating cover that covers a portion of the shield member exposed portion;

a waterproofing agent applied to the shield member exposed portion and permeated into the electromagnetic shield member, a reinforcing member that is attached to the shielded electric wire, and an exterior member that covers the shielded electric wire and the entire reinforcing member, wherein the waterproofing agent is in tight contact with an inner circumferential surface of an end portion of the sheath on the shield member exposed portion side and an outer circumferential surface of the first insulating coating so that a waterproofing area is formed, the insulating cover is a portion of the sheath made by partially cutting away the sheath, the sheath includes a first split sheath portion that is located on one side of the shield member exposed portion in a first direction that is a lengthwise direction of the shielded electric wire, the insulating cover is separated from the first split sheath portion in the first direction, and the reinforcing member is provided along the first split sheath portion, and is more rigid than the shielded electric wire.

\* \* \* \* \*